United States Patent
Oh et al.

(10) Patent No.: US 10,243,164 B2
(45) Date of Patent: Mar. 26, 2019

(54) FLEXIBLE DISPLAY APPARATUS

(71) Applicant: Samsung Display Co., Ltd., Yongin-si, Gyeonggi-do (KR)

(72) Inventors: Hyunjoon Oh, Yongin-si (KR); Boa Kim, Yongin-si (KR); Sanghoon Kim, Yongin-si (KR); Sangil Park, Yongin-si (KR); Heonjung Shin, Yongin-si (KR); Hyejin Oh, Yongin-si (KR); Jeoungsub Lee, Yongin-si (KR); Minhoon Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/596,929

(22) Filed: May 16, 2017

(65) Prior Publication Data

US 2017/0338440 A1 Nov. 23, 2017

(30) Foreign Application Priority Data

May 18, 2016 (KR) .................... 10-2016-0060905

(51) Int. Cl.
*H01L 51/52* (2006.01)
*H01L 51/00* (2006.01)
*H01L 27/32* (2006.01)

(52) U.S. Cl.
CPC ...... *H01L 51/5237* (2013.01); *H01L 51/5281* (2013.01); *H01L 27/3244* (2013.01); *H01L 51/0097* (2013.01); *H01L 2251/5338* (2013.01)

(58) Field of Classification Search
CPC .......... H01L 27/1259; H01L 27/124; H01L 27/1218; H01L 2251/5338; H01L 51/5237; H01L 51/5253
See application file for complete search history.

(56) References Cited

U.S. PATENT DOCUMENTS

| 8,709,566 | B2 | 4/2014 | Kim | |
| 2006/0039575 | A1* | 2/2006 | Wada | H04R 1/025 381/152 |
| 2013/0320338 | A1* | 12/2013 | Ono | H01L 21/02554 257/43 |
| 2014/0376162 | A1* | 12/2014 | Lim | G09F 9/30 361/679.01 |
| 2015/0123860 | A1 | 5/2015 | Park et al. | |
| 2016/0001521 | A1 | 1/2016 | Tanaka et al. | |
| 2016/0035812 | A1* | 2/2016 | Kwon | H01L 27/3276 257/40 |

(Continued)

FOREIGN PATENT DOCUMENTS

| JP | 2000-206898 A | 7/2000 |
| JP | 2011-173410 A | 9/2011 |

(Continued)

*Primary Examiner* — Changhyun Yi
(74) *Attorney, Agent, or Firm* — Innovation Counsel LLP (57) ABSTRACT

A flexible display apparatus includes a substrate having a bending portion, a display over the substrate, and a cover over the substrate and covering the display. The cover includes a first film having a first surface and a second surface opposite the first surface, a second film over the first film, and an adhesive layer between the first film and the second film and attaching the first film to the second film. The first film includes at least one division line in at least some regions thereof in a direction from the first surface toward the second surface.

16 Claims, 8 Drawing Sheets

(56) References Cited

U.S. PATENT DOCUMENTS

| | | | |
|---|---|---|---|
| 2016/0204366 A1* | 7/2016 | Zhang | H01L 23/4985 |
| | | | 257/40 |
| 2016/0225859 A1* | 8/2016 | Takata | H01L 29/24 |
| 2017/0125501 A1* | 5/2017 | Lim | H01L 27/3262 |
| 2017/0192508 A1* | 7/2017 | Lim | G06F 3/016 |
| 2017/0192595 A1* | 7/2017 | Choi | G06F 3/0416 |
| 2017/0327475 A1* | 11/2017 | Ishima | C09K 3/00 |

FOREIGN PATENT DOCUMENTS

| | | |
|---|---|---|
| JP | 3200045 U | 9/2015 |
| KP | 10-2016-0004456 A | 1/2016 |

\* cited by examiner

FLEXIBLE DISPLAY APPARATUS

CROSS-REFERENCE TO RELATED APPLICATION

This application claims the benefit of Korean Patent Application No. 10-2016-0060905, filed on May 18, 2016, in the Korean Intellectual Property Office, the disclosure of which is incorporated herein in its entirety by reference.

BACKGROUND

1. Field

One or more embodiments relate to a flexible display apparatus.

2. Description of the Related Art

With the advances in information technologies, the market for display apparatuses used as connecting media between users and information is growing. Accordingly, the use of display apparatuses has increased, and examples of the display apparatuses include liquid crystal displays (LCD), organic light-emitting diode displays (OLED), electrophoretic displays (EPD), and plasma display panels (PDP).

Recently, there is a need for a flexible display panel that is bendable in various directions as well as a flat-panel display panel.

However, if a film having a low density is used in a bending portion of a flexible display panel, the flexible display apparatus may be torn in the bending portion.

SUMMARY

One or more embodiments include a flexible display apparatus including a cover having a buffer film capable of efficiently absorbing an external shock without being torn even in a bending portion.

Additional aspects will be set forth in part in the description which follows and, in part, will be apparent from the description, or may be learned by practice of the presented embodiments.

According to one or more embodiments, a flexible display apparatus includes: a substrate having a bending portion; a display over the substrate; and a cover over the substrate and covering the display, wherein the cover includes: a first film having a first surface and a second surface opposite the first surface; a second film over the first film; and an adhesive layer between the first film and the second film and attaching the first film to the second film, and the first film includes at least one division line in at least some regions thereof in a direction from the first surface toward the second surface.

The at least one division line may penetrate from the first surface to the second surface of the first film.

The at least one division line may include two or more division lines, and the at least one division line may include n division lines that divide the first film into n+1 regions.

The at least one division line may be at a position corresponding to the bending portion.

The at least one division line may include two or more division lines throughout the first film.

The at least one division line may include two or more division lines, and an interval between the two or more division lines at a position corresponding to the bending portion may be different from an interval between the two or more division lines at other positions.

The interval between the two or more division lines at the position corresponding to the bending portion may be less than the interval between the two or more division lines at the other positions.

A length of the at least one division line may be less than a thickness of the first film.

The length of the at least one division line may be half the thickness of the first film.

The first film may further include a healing agent.

When the first film is torn, a healing material discharged from the healing agent may be cross-linked to a material constituting the first film.

The first film may be a buffer film.

The first film may include an elastomer-based material.

The first film may include at least one selected from the group consisting of urethane, acrylate, and silicone.

The first film may include a plurality of air pores and have a foam density of about 0.3 $g/cm^3$ to about 0.7 $g/cm^3$.

The first film may have a thickness of about 50 μm to about 150 μm.

The at least one division line may include two or more division lines, and an interval between the two or more division lines may be in a range from about 10 μm to about 1 mm.

The flexible display apparatus may further include a third film under the first film, wherein the second film may be a light blocking film and the third film may be a heat dissipation film.

The at least one division line may be formed from the first surface toward the second surface of the first film by a blanking process.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of" when preceding a list of elements, modify the entire list of elements and do not modify the individual elements of the list.

Various alterations and modifications may be made to embodiments, some of which will be illustrated in detail in the drawings and detailed description. The effects and features, and methods of achieving the effects and features will become apparent from the embodiments described below in detail with reference to the accompanying drawings. However, the inventive concept is not limited to the following embodiments and may be realized in various forms.

It will be understood that although the terms "first", "second", etc. may be used herein to describe various components, these components should not be limited by these terms. These components are only used to distinguish one component from another.

As used herein, the singular forms "a," "an", and "the" are intended to include the plural forms as well, unless the context clearly indicates otherwise.

It will be understood that the terms "comprise", "include", and "have" used herein specify the presence of stated features or elements, but do not preclude the presence or addition of one or more other features or elements.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. For example, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Figure 1:
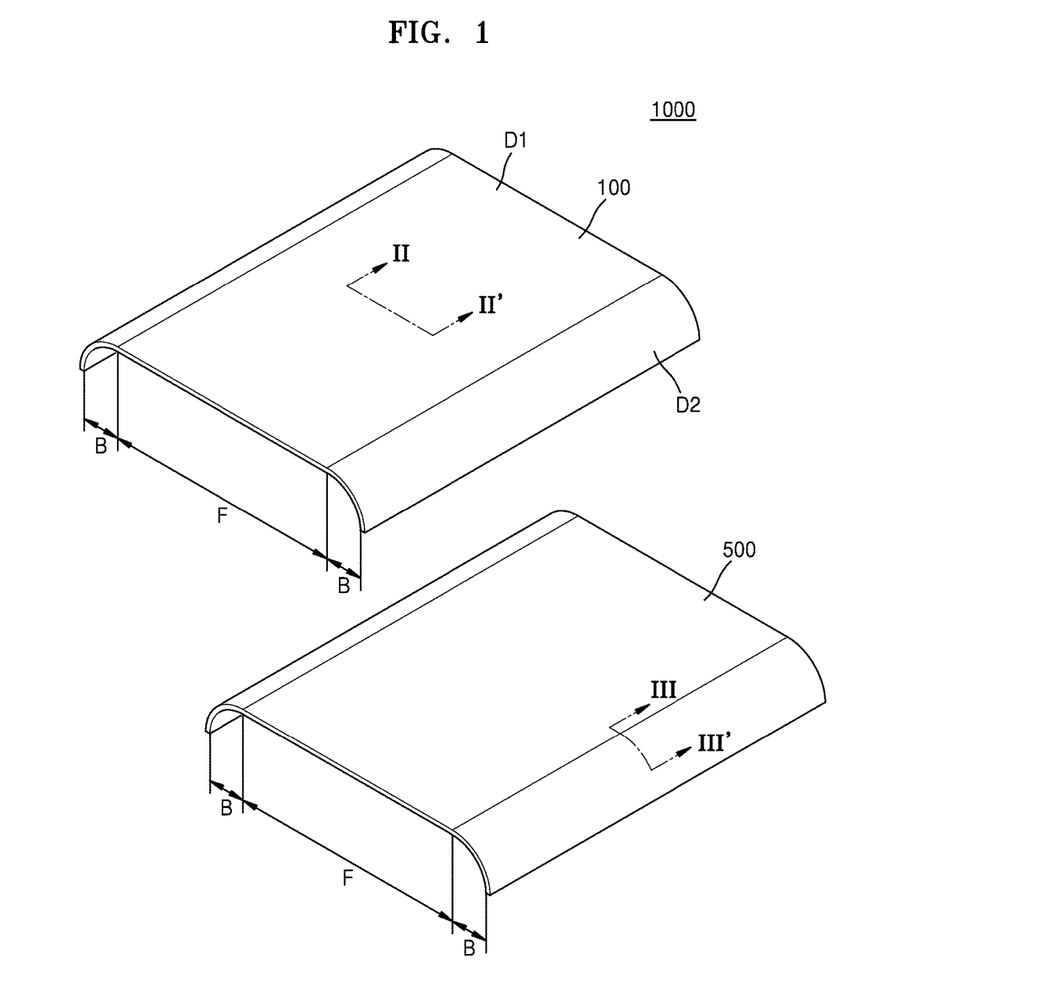
FIG. 1 is a schematic perspective view of a flexible display apparatus according to an embodiment.
Figure 2:
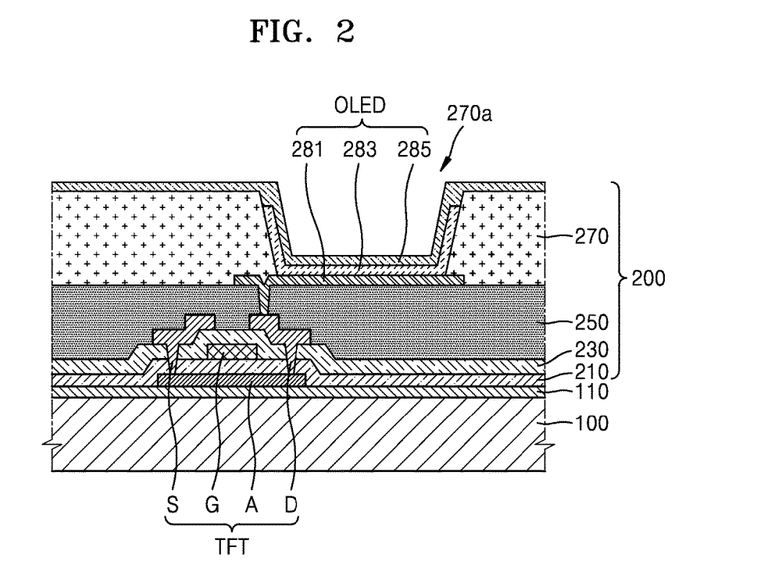
FIG. 2 is a schematic cross-sectional view taken along line II-II' of FIG. 1, according to an embodiment.
Figure 3A:
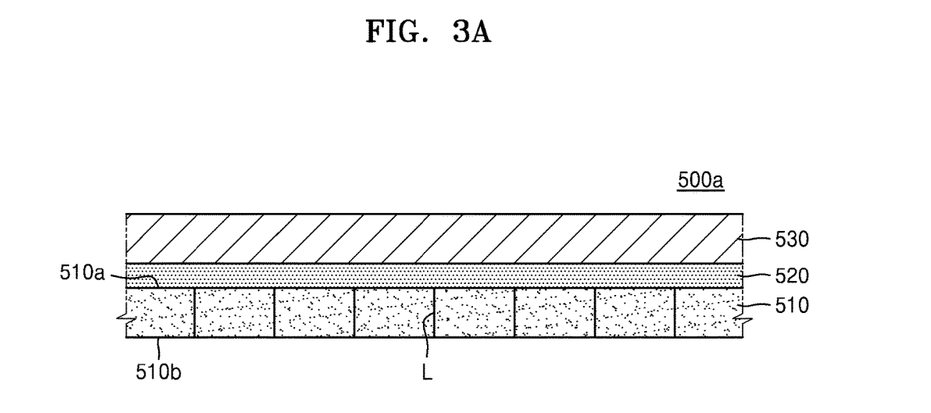
FIG. 3A is a schematic cross-sectional view taken along line III-III' of FIG. 1, according to an embodiment.

FIG. 1 is a schematic perspective view of a flexible display apparatus 1000 according to an embodiment, and FIG. 2 is a schematic cross-sectional view taken along line II-II' of FIG. 1, according to an embodiment. FIG. 3A is a schematic cross-sectional view taken along line III-III' of FIG. 1, according to an embodiment.

Referring to FIGS. 1 and 2, the flexible display apparatus 1000 according to the embodiment may include a substrate 100, a display 200 over the substrate 100, and a cover 500 over the substrate 100 and covering the display 200.

The substrate 100 may include a flexible plastic material. For example, the substrate 100 may include polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), or cellulose acetate propionate (CAP).

According to an embodiment, when the flexible display apparatus 1000 is a bottom-emission type display apparatus in which an image is realized toward the substrate 100, the substrate 100 may include a transparent material. According to another embodiment, when the flexible display apparatus 1000 is a top-emission type display apparatus in which an image is realized toward the display 200, the substrate 100 need not include a transparent material. In this case, the substrate 100 may include a flexible opaque metal. According to another embodiment, when the substrate 100 is formed using a metal, the substrate 100 may include at least one selected from the group consisting of iron, chromium, manganese, nickel, titanium, molybdenum, stainless steel (SUS), an Invar alloy, an Inconel alloy, and a Kovar alloy. Also, the substrate 100 may include a metal foil.

The substrate 100 may include a flat portion F and at least one bending portion B. The bending portion B is continuous to the flat portion F. FIG. 1 illustrates an example in which the substrate 100 includes a pair of bending portions B on both sides of the flat portion F. The pair of bending portions B may have the same shape or may have different shapes. Also, the pair of bending portions B may have a constant curvature or may have a varying curvature. However, embodiments of the present disclosure are not limited thereto. The bending portion B may be variously formed. For example, the bending portion B may be formed only at one edge of the flat portion F, at all edges of the flat portion F, or inside the flat portion F.

The display 200 may be over the substrate 100 and realize an image. The display 200 may include a first display region D1 over the flat portion F and a second display region D2 over the at least one bending portion B. The first display region D1 may be continuous to the second display region D2. The first display region D1 and the second display region D2 may form a single screen or different screens.

The display 200 may include, for example, a thin film transistor TFT and an organic light-emitting device OLED, hereinafter the TFT and the OLED, respectively. However, embodiments of the present disclosure are not limited thereto. The display 200 may include various types of display elements.

Hereinafter, the display 200 in the first display region D1 will be described in more detail with reference to FIG. 2.

A buffer layer 110 may be formed over the substrate 100. The buffer layer 110 may prevent impurity ions from diffusing into the display 200, may prevent penetration of moisture or outside air, and may serve as a barrier layer and/or a blocking layer for planarizing the surface of the substrate 100. For example, the buffer layer 110 may include an inorganic material, such as silicon oxide, silicon nitride, silicon oxynitride, aluminum oxide, aluminum nitride, titanium oxide, titanium nitride, or the like, an organic material, such as polyimide, polyester, acryl, or the like, or any laminate including two or more of the materials listed above.

A TFT may be formed over the substrate 100. The TFT may include a semiconductor layer A, a gate electrode G, a source electrode S, and a drain electrode D. FIG. 2 illustrates a top gate type TFT including the semiconductor layer A, the gate electrode G, the source electrode S, and the drain electrode D in this stated order, but embodiments of the present disclosure are not limited thereto. Various types of the TFT, such as a bottom gate type TFT, may be used.

The semiconductor layer A may include an organic semiconductor or an inorganic semiconductor such as silicon. Also, the semiconductor layer A has a source region, a drain region, and a channel region therebetween. For example, in a case where the semiconductor layer A is formed using amorphous silicon, an amorphous silicon layer may be formed on an entire surface of the substrate 100 and crystallized to form a polycrystalline silicon layer. The polycrystalline silicon layer may be patterned. Then, impurities may be doped into both edges of the polycrystalline silicon layer, i.e., the source region and the drain region, to thereby form the semiconductor layer A including the source region, the drain region, and the channel region therebetween.

After the semiconductor layer A is formed, a gate insulating film 210 may be formed on the entire surface of the substrate 100 and over the semiconductor layer A. The gate insulating film 210 may include a single-layered or multi-layered film including an inorganic material such as silicon oxide or silicon nitride. The gate insulating film 210 may insulate the semiconductor layer A from the gate electrode G thereover.

The gate electrode G may be formed in a certain region over the gate insulating film 210. The gate electrode G is connected to a gate line (not illustrated) through which a TFT on/off signal is applied. The gate electrode G may include at least one selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu), but embodiments of the present disclosure are not limited thereto. The gate electrode G may include various materials by taking into account a design condition.

After the gate electrode G is formed, an interlayer insulating film 230 may be formed on the entire surface of the substrate 100 in order for an insulation between the gate electrode G and the source electrode S and an insulation between the gate electrode G and the drain electrode D.

The interlayer insulating film 230 may include an inorganic material. For example, the interlayer insulating film 230 may include metal oxide or metal nitride. Specifically, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

The interlayer insulating film 230 may include a single-layered or multi-layered film including an inorganic material such as silicon oxide ($SiO_x$) or silicon nitride ($SiN_x$). In some embodiments, the interlayer insulating film 230 may have a double structure of $SiO_x$ and $SiN_y$, or $SiN_x$ and $SiO_y$.

A source electrode S and a drain electrode D are formed over the interlayer insulating film 230. Specifically, the interlayer insulating film 230 and the gate insulating film 210 are formed to expose the source region and the drain region of the semiconductor layer A, and the source electrode S and the drain electrode D are formed to contact the exposed source region and the exposed drain region of the semiconductor layer A.

Each of the source electrode S and the drain electrode D may have a single-layered or multi-layer structure including at least one selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The TFT is electrically connected to the OLED to apply an OLED driving signal to the OLED. In order to protect the TFT, the TFT may be covered with a planarization film 250.

The planarization film 250 may include an inorganic insulating film and/or an organic insulating film. The inorganic insulating film may include $SiO_2$, $SiN_x$, SiON, $Al_2O_3$, $TiO_2$, $Ta_2O_5$, $HfO_2$, $ZrO_2$, BST, or PZT, and the organic insulating film may include a general-purpose polymer (PMMA, PS), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, and any blend thereof. Also, the planarization film 250 may include a complex laminate of an inorganic insulating film and an organic insulating film.

The OLED may be over the planarization film 250. The OLED may include a first electrode 281, an intermediate layer 283 including an organic emission layer, and a second electrode 285. Holes and electrons, which are respectively injected from the first electrode 281 and the second electrode 285 of the OLED, may recombine in the organic emission layer of the intermediate layer 283 to generate light.

The first electrode 281 is formed over the planarization film 250 and is electrically connected to the drain electrode D through a contact hole of the planarization film 250. However, embodiments of the present disclosure are not limited to the case where the first electrode 281 is electrically connected to the drain electrode D. The first electrode 281 may be electrically connected to the source electrode S to receive the OLED driving signal.

The first electrode 281 may be a reflective electrode and may include a reflective film and a transparent or translucent electrode layer over the reflective film. The reflective film may include Ag, Mg, Al, Pt, Pd, Au, Ni, Nd, Ir, Cr, or any compound thereof. The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The intermediate layer 283 may include an organic emission layer. Alternatively, the intermediate layer 283 may include an organic emission layer and may further include at least one selected from among a hole injection layer (HIL), a hole transport layer (HTL), an electron transport layer (ETL), and an electron injection layer (EIL). The embodiment of the present disclosure is not limited thereto and the intermediate layer 283 may include an organic emission layers and may further include various function layers.

The second electrode 285 is formed over the intermediate layer 283. The second electrode 285 forms an electric field with the first electrode 281 so that light is emitted from the intermediate layer 283. The first electrode 281 may be patterned at each pixel and the second electrode 285 may be formed so that a common voltage is applied to the entire pixels.

The second electrode 285 facing the first electrode 281 may be a transparent or translucent electrode and may be a metal thin film that has a low work function and includes Li, Ca, LiF/Ca, LiF/Al, Al, Ag, Mg, or any compound thereof. Also, an auxiliary electrode layer or a bus electrode may be further formed over the metal thin film. The auxiliary electrode layer or the bus electrode may include a material for forming a transparent electrode, such as ITO, IZO, ZnO, or $In_2O_3$.

Accordingly, the second electrode 285 may transmit light emitted from the organic emission layer (not illustrated) included in the intermediate layer 283. That is, the light emitted from the organic emission layer (not illustrated) may be reflected directly or by the first electrode 281 including a reflective electrode and then emitted toward the second electrode 285.

However, the display 200 according to the embodiment is not limited to the top-emission type display, and the display 200 may be a bottom-emission type display in which light emitted from the organic emission layer (not illustrated) is emitted toward the substrate 100. In this case, the first electrode 281 may be a transparent or translucent electrode, and the second electrode 285 may be a reflective electrode. Also, the display 200 according to the embodiment may be a double-side-emission type display in which light is emitted in two directions, that is, frontward and rearward.

Alternatively, the first electrode 281 may be patterned, for example, at each pixel. The display 200 may further include a pixel defining film 270 over the first electrode 281. The pixel defining film 270 may include an opening 270a extending to and exposing the first electrode 281. The intermediate layer 283 may be formed corresponding to the opening 270a and electrically connected to the first electrode 281. The pixel defining film 270 may include at least one organic insulating material selected from the group consisting of polyimide, polyamide, an acryl resin, benzocyclobutene, and a phenol resin and may be formed by spin coating or the like.

The cover 500 may be over the substrate 100 so as to cover the display 200 disposed over the substrate 100.

Alternatively, the cover 500 may include a cover glass containing a glass material. Any material may be used as the cover 500 as long as the material is attachable to the upper portion of the substrate 100 so as to cover the display 200.

As illustrated in FIG. 3A, a cover 500a of the flexible display apparatus 1000 according to the embodiment may include a first film 510, a second film 530, and an adhesive layer 520 between the first film 510 and the second film 530 and attaching the first film 510 to the second film 530.

The first film 510 may include a first surface 510a and a second surface 510b opposite the first surface 510a. The first film 510 may include division lines L in at least some regions thereof in a direction from the first surface 510a toward the second surface 510b. The division lines L may be cuts in the first film 510.

Alternatively, the division lines L are illustrated in FIG. 3A as being formed from the first surface 510a to the second surface 510b, but this is merely an example. An embodiment in which the division lines L are partially formed will be described later in detail.

In the display apparatus 1000 according to the embodiment, the division lines L penetrating the first film 510 may be formed from the first surface 510a toward the second surface 510b. That is, the first film 510 may be divided into two regions by one division line L.

The first film 510 illustrated in FIG. 3A includes seven division lines L, but the number of division lines L is not limited thereto. One or more division lines L, sometime called at least one division line L, may be formed from the first surface 510a toward the second surface 510b without limitations.

Alternatively, the division lines L included in the first film 510 may be formed by a blanking process. The blanking process could be cutting process for obtaining desired shape.

In the display apparatus 1000 according to the embodiment, n division lines L may be formed in the first film 510 by a blanking process to penetrate from the first surface 510a to the second surface 510b. Accordingly, the first film 510 may be divided into n+1 regions.

Figure 4:
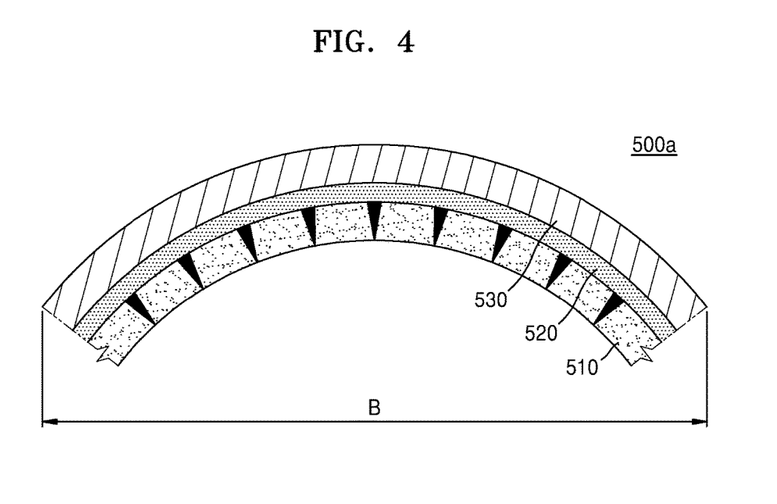
FIG. 4 is a schematic cross-sectional view illustrating a case where a cover of FIG. 3A is bent.

Since a plurality of division lines L are formed in the first film 510 to penetrate from the first surface 510a to the second surface 510b, the first film 510 may be divided by the division lines L even when the cover 500 is bent in a bending portion B as illustrated in FIG. 4. Accordingly, even when tensile stress is applied to the first film 510 by the bending, a risk of tearing may be reduced.

Figure 3B:
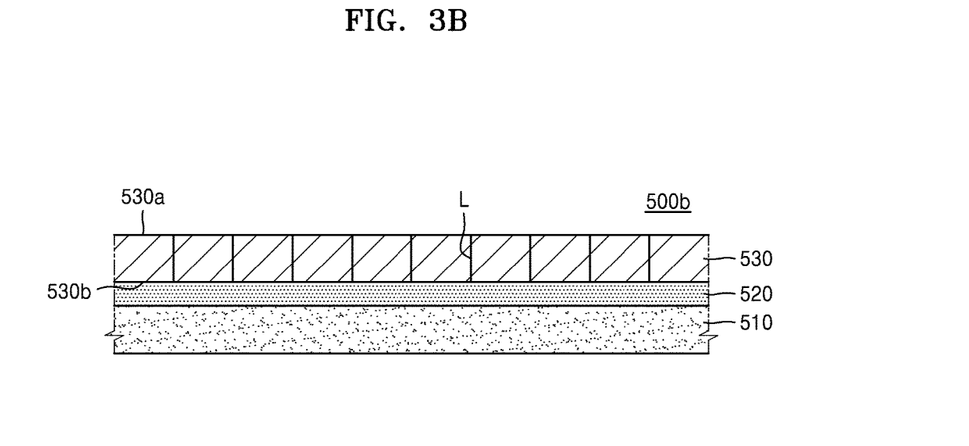
FIG. 3B is a schematic cross-sectional view taken along line III-III' of FIG. 1, according to another embodiment.
Figure 3C:
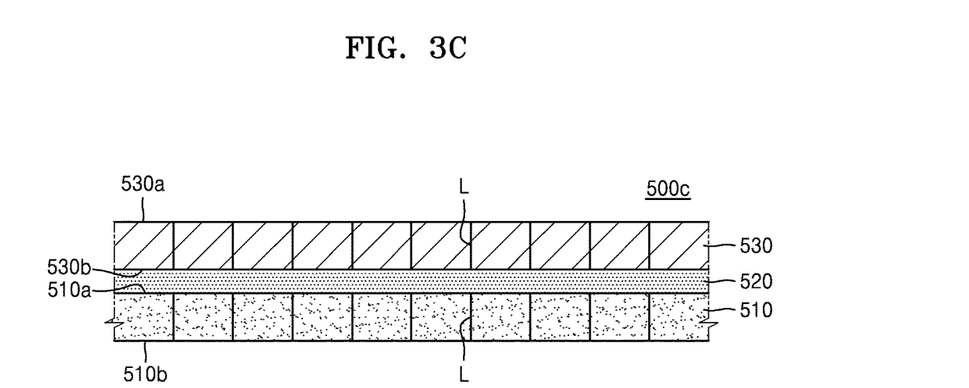
FIG. 3C is a schematic cross-sectional view taken along line III-III' of FIG. 1, according to another embodiment.

FIG. 3B is a schematic cross-sectional view taken along line III-III' of FIG. 1, according to another embodiment, and FIG. 3C is a schematic cross-sectional view taken along line III-III' of FIG. 1, according to another embodiment. In FIGS. 3B and 3C, the same reference numerals as those used in FIG. 3A refer to the same members, and redundant descriptions thereof will be omitted for conciseness.

A cover 500b of the flexible display apparatus according to the embodiment of FIG. 3B may include a first film 510, a second film 530, and an adhesive layer 520 between the first film 510 and the second film 530 and attaching the first film 510 to the second film 530. The second film 530 may include a first surface 530a, a second surface 530b, and division lines L penetrating the second film 530 in a direction from the first surface 530a toward the second surface 530b.

Like the division lines L in the first film 510 of FIG. 3A, the number and positions of division lines L in the second film 530 are not particularly limited. n division lines L may be formed in at least some regions of the second film 530 to thereby divide the second film 530 into n+1 regions.

Alternatively, as illustrated in FIG. 3C, each of a first film 510 and a second film 530 of a cover 500c may include division lines L.

FIG. 3C illustrates the cover 500c in which the first film 510 and the second film 530 include the same number of division lines L at the same positions, but the cover 500c is not limited thereto. The first film 510 and the second film 530 may include one or more division lines L in different number at different positions.

Alternatively, in FIGS. 3A to 3C, the first film 510 may be a buffer film. That is, the first film 510 may have an elastic force and may absorb a shock when the flexible display apparatus 1000 is deformed or receives an external force, thereby preventing the cover 500 from being damaged.

Alternatively, in a case where the first film 510 is a buffer film, the first film 510 may include an elastomer-based material. For example, the first film 510 may include at least one selected from the group consisting of urethane, acrylate, and silicone.

In a case where the first film 510 is a buffer film, as a density of the first film 510 becomes higher, a deformation rate of the first film 510 is reduced and it is more likely that the first film 510 will be torn when the flexible display apparatus 1000 is deformed.

Accordingly, in the flexible display apparatus 1000 according to the embodiment, the first film 510 may have an elastic force so as to serve as the buffer film and may include a plurality of air pores so as to prevent the cover 500 from being damaged even when an external force is applied to the cover 500. Alternatively, the first film 510 may have a foam density of about 0.3 g/cm$^3$ to about 0.7 g/cm$^3$.

Alternatively, the first film 510 may have a thickness of about 50 μm to about 150 μm.

Alternatively, the adhesive layer 520 may include any material as long as the material attaches the first film 510 to the second film 530. The adhesive layer 520 may have a thickness of about 20 μm to about 50 μm. However, the thicknesses of the first film 510 and the adhesive layer 520 are not limited to the above-mentioned values.

Alternatively, in FIGS. 3A to 3C, the second film 530 may be a light blocking film. That is, the second film 530 may block light so as to prevent lower components from being exposed to the outside through the cover 500. Hence, the second film 530 may have a dark color. Alternatively, the light blocking film 530 may include division lines L penetrating the light blocking film 530 in a direction from the first surface 530a toward the second surface 530b.

Alternatively, in FIGS. 3A to 3C, the second film 530 may be a lower protective film. The lower protective film protects lower components of the cover 500 and the substrate 100, in which the display 200 is disposed, from an external force. Alternatively, the lower protective film 530 may include division lines L penetrating the lower protective film 530 in a direction from the first surface 530a toward the second surface 530b.

In the related art, the flexible display apparatus may be bent in the bending portion as described above, and the first film and/or the second film included in the cover may receive compression stress and/or tensile stress in a bending portion. Consequently, the first film and/or the second film may be torn due to the tensile stress in the bending portion. In particular, when the first film is a buffer film, the first film may include a plurality of air pores and have a foam density range of about 0.3 g/cm³ to about 0.7 g/cm³. Accordingly, a probability of being torn in the bending portion increases.

On the contrary, in the flexible display apparatus 1000 according to the embodiment, since the first film 510 and/or the second film 530 include division lines L in at least some regions thereof, the first film 510 and/or the second film 530 divided by the division lines L is not torn, but a gap therein is opened with respect to the division lines L. Accordingly, even when the bending occurs, the probability that the first film 510 and/or the second film 530 will be torn is minimized, thereby improving the reliability of the cover 500 and the flexible display apparatus 1000.

FIG. 4 is a schematic cross-sectional view illustrating a case where the cover 500a of FIG. 3A is deformed. As illustrated in FIG. 4, in a case where the first film 510 includes division lines L penetrating the first film 510 in a direction from the first surface 510a toward the second surface 510b, even when the bending occurs, the first film 510 is not torn, but a gap is naturally opened between regions having already been divided with respect to the division lines L, thereby obtaining the effect that the first film 510 is not torn.

Figure 5:
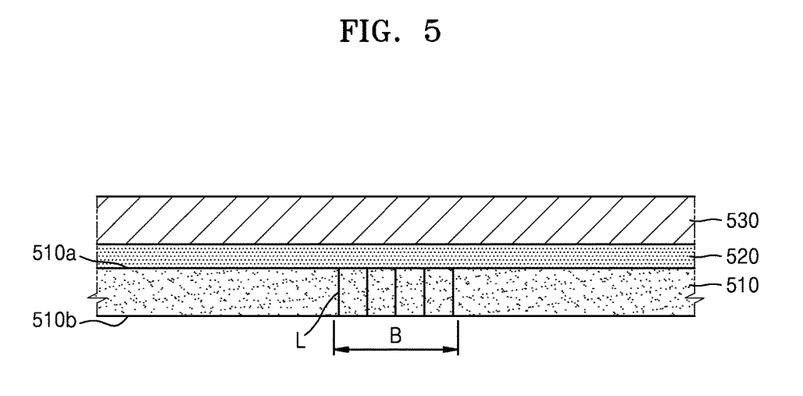
FIG. 5 is a schematic cross-sectional view of a cover according to another embodiment.
Figure 6:
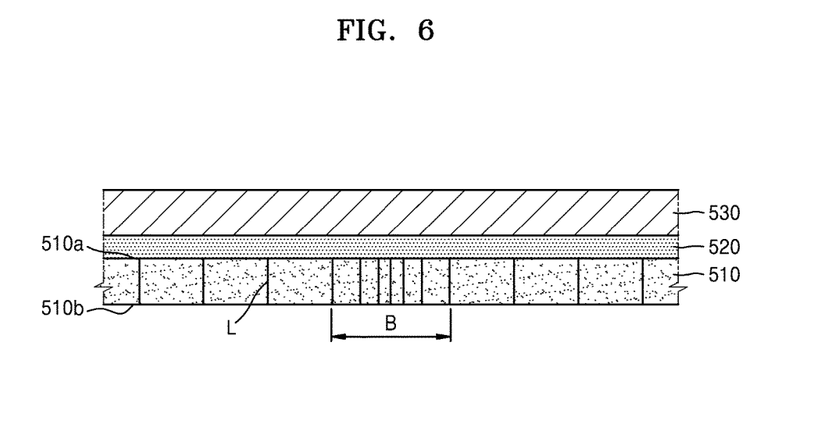
FIG. 6 is a schematic cross-sectional view of a cover according to another embodiment.

FIG. 5 is a schematic cross-sectional view of a cover according to another embodiment, and FIG. 6 is a schematic cross-sectional view of a cover according to another embodiment. In FIGS. 5 and 6, the same reference numerals as those used in FIG. 3A refer to the same members, and redundant descriptions thereof will be omitted for conciseness.

The cover 500 according to the embodiment may include a first film 510 having division lines L only in a bending portion B. Alternatively, the first film 510 may be a buffer film. In this case, the first film 510 may include an elastomer-based material having an elastic force to absorb a shock. Also, the first film 510 may include a plurality of air pores and may have a low density accordingly.

In the flexible display apparatus according to the embodiment, since tensile stress and compression stress applied to the first film 510 are maximum in the bending portion B, the probability that the first film 510 having a low forming density will be torn at the bending portion B is highest. Accordingly, the first film 510 may include division lines L only in the bending portion B.

As described above with reference to FIG. 3A, the division lines L may penetrate from the first surface 510a toward the second surface 510b of the first film 510 in the bending portion B.

However, the number and positions of division lines L are not limited to the example illustrated in FIG. 5. Alternatively, the division lines L may be formed only in the bending portion B of the second film 530, or may be formed in both the bending portion of the first film 510 and the bending portion of the second film 530.

Alternatively, in a case where the division lines L are formed in the bending portions B of the first film 510 and the second film 530, the number and positions of division lines L may be equally or differently formed.

Alternatively, as illustrated in FIG. 6, a gap between the division lines L in the bending portion B of the first film 510 may be different from a gap between the division lines L in the other portions of the first film 510.

The gap between the division lines L may be narrow (less) in the bending portion B having maximum tensile stress and compression stress and may gradually increase as a distance from the bending portion B increases.

Since the gap between the division lines L is narrow (small) in the bending portion B, the first film 510 is divided into more regions and a flexibility thereof is improved even when the bending occurs, thereby reducing the probability that the first film 510 will be torn.

The number and positions of division lines L are not limited to the example illustrated in FIGS. 5 and 6. Alternatively, the division lines L may be formed only in the bending portion B of the second film 530, or may be formed in both the bending portion of the first film 510 and the bending portion of the second film 530.

Alternatively, in a case where the division lines L are formed in the bending portions B of the first film 510 and the second film 530, the number and positions of division lines L may be equally or differently formed.

Figure 7A:
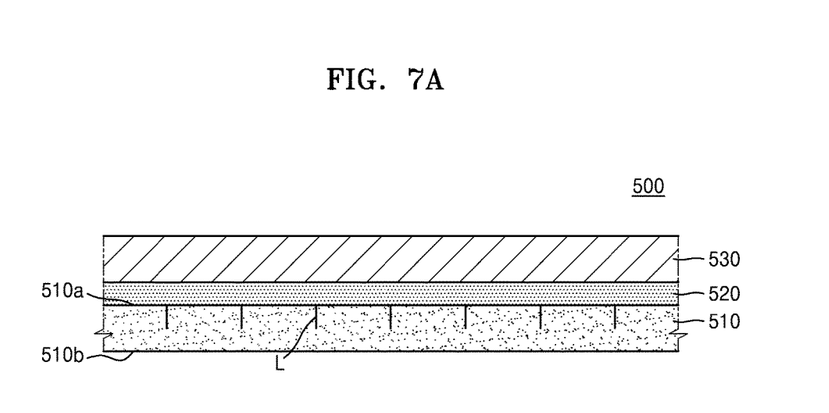
FIG. 7A is a schematic cross-sectional view of a cover according to another embodiment.

FIG. 7A is a schematic cross-sectional view of a cover 500 according to another embodiment. In FIG. 7A, the same reference numerals as those used in FIG. 3A refer to the same members, and redundant descriptions thereof will be omitted for conciseness.

In the cover 500 according to the embodiment, one or more division lines L may be formed from a first surface 510a toward a second surface 510b of a first film 510. A length of the division line L may be less than a thickness of the first film 510.

That is, the division line L does not completely penetrate the first film 510 from the first surface 510a to the second surface 510b, and the division line L may be formed from the first surface 510a toward the second surface 510b and has a length less than the thickness of the first film 510 so that the division line L does not reach the second surface 510b.

Alternatively, the division line L may be formed up to a position corresponding to half the thickness of the first film 510.

In a case where the length of the division line L is less than the thickness of the first film 510, the first film 510 is not completely divided by the division line L, but the first film 510 may be opened with respect to the division line L.

Accordingly, when the cover 500 is bent in the bending portion B, the first film 510 is not torn to thereby improve the reliability of the cover 500 and the flexible display apparatus.

As illustrated in FIG. 4, when the bending occurs in the bending portion B, the second surface 510b of the first film 510 receives a compression force and a contraction force, and the first surface 510a opposite the second surface 510b of the first film 510 receives a stretching force and a tensile force.

It is more likely that a region close to the first surface 510a of the first film 510 receiving the tensile force will be torn, as compared to a region close to the second surface 510b of the first film 510 receiving the contraction force. Accordingly, as illustrated in FIG. 7A, the division lines L may be partially formed only in the region close to the first surface 510a of the first film 510.

Figure 7B:
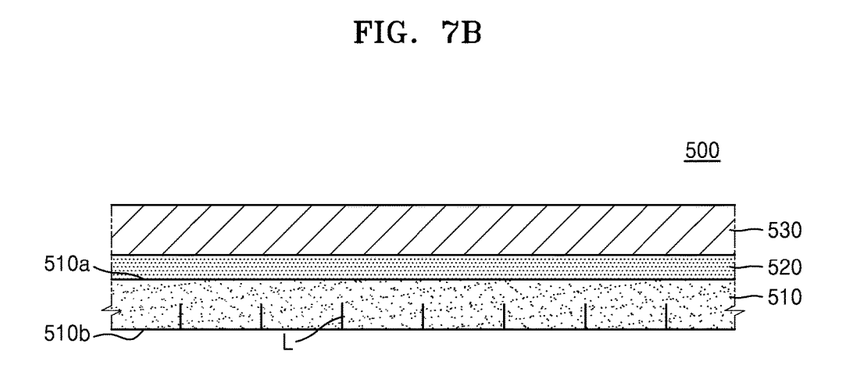
FIG. 7B is a schematic cross-sectional view of a cover according to another embodiment.

FIG. 7B is a schematic cross-sectional view of a cover 500 according to another embodiment. In FIG. 7B, the same reference numerals as those used in FIG. 3A refer to the same members, and redundant descriptions thereof will be omitted for conciseness.

Alternatively, the bending may occur in the bending portion B in opposite direction as shown in FIG. 4, thus the second surface 510b of the first film 510 receives a tensile force, and the first surface 510a receives a compression force.

In the cover 500 according to the embodiment, one or more division lines L may be formed from a second surface 510b toward a first surface 510a of a first film 510. A length of the division line L may be less than a thickness of the first film 510.

However, the number and positions of division lines L are not limited to the examples illustrated in FIGS. 7A and 7B. Alternatively, the division lines L may be formed in some regions of the second film 530, or may be formed in some regions of both the first film 510 and the second film 530.

Alternatively, in a case where the division lines L are formed in some regions of both the first film 510 and the second film 530, the number and positions of division lines L may be equally or differently formed.

Alternatively, the division line L may be formed up to a position corresponding to half the thickness of the first film 510 and/or the second film 530, or may be formed only in the bending portion B.

Alternatively, the division line L may be formed up to a position corresponding to half the thickness of the first film 510 and/or the second film 530. A gap between the division lines L may be narrow in the bending portion B receiving a high tensile force and a high compression force and may be wide in the other portions except for the bending portion B.

Figure 8:
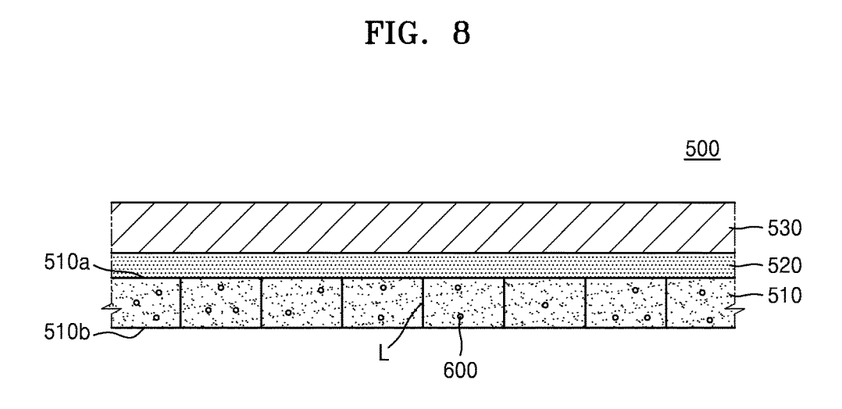
FIG. 8 is a schematic cross-sectional view of a cover according to another embodiment.

FIG. 8 is a schematic cross-sectional view of a cover 500 according to another embodiment. In FIG. 8, the same reference numerals as those used in FIG. 3A refer to the same members, and redundant descriptions thereof will be omitted for conciseness.

In the cover 500 of the flexible display apparatus according to the embodiment, a first film 510 may include one or more division lines L and one or more healing agents 600.

As illustrated in FIG. 8, the healing agent 600 may include a plurality of grains and may be included in the first film 510. However, the number and shape of healing agents 600 are not limited thereto.

When the first film 510 is unexpectedly torn in a bending process of the flexible display apparatus, the healing agents 600 included in the first film 510 may be decomposed to discharge healing materials. These healing materials are cross-linked to a material constituting the first film 510 and have an effect that can self-heal the torn first film 510.

Therefore, the healing agent 600 is a grain including a material that is cross-linked to the material constituting the first film 510, and a heating material is confined in the grain in a normal condition. When the first film 510 is torn, the healing agent 600 is decomposed to discharge the healing material. The healing material is cross-linked to the material constituting the first film 510, so that the torn portion of the first film 510 is attached again.

Figure 9A:
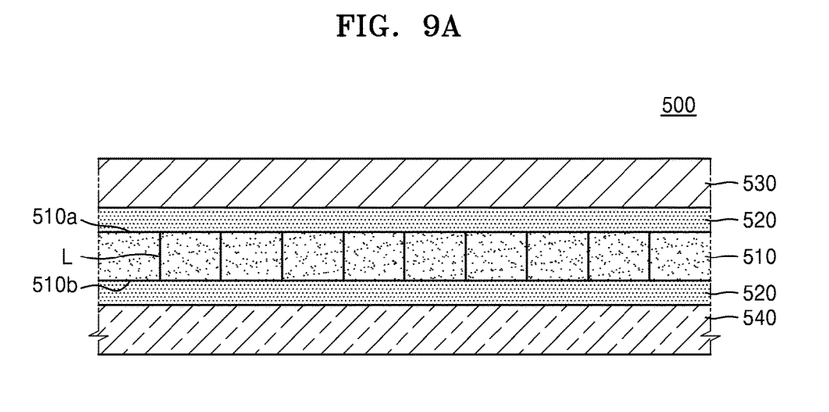
FIG. 9A is a schematic cross-sectional view of a cover according to another embodiment.
Figure 9B:
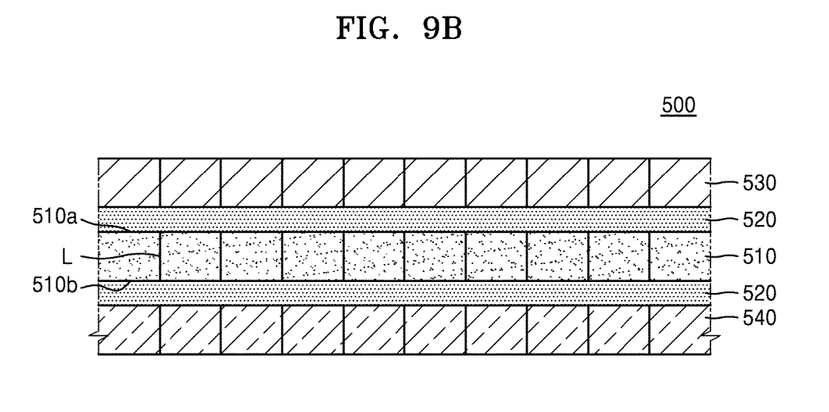
FIG. 9B is a schematic cross-sectional view of a cover according to another embodiment.
Figure 10:
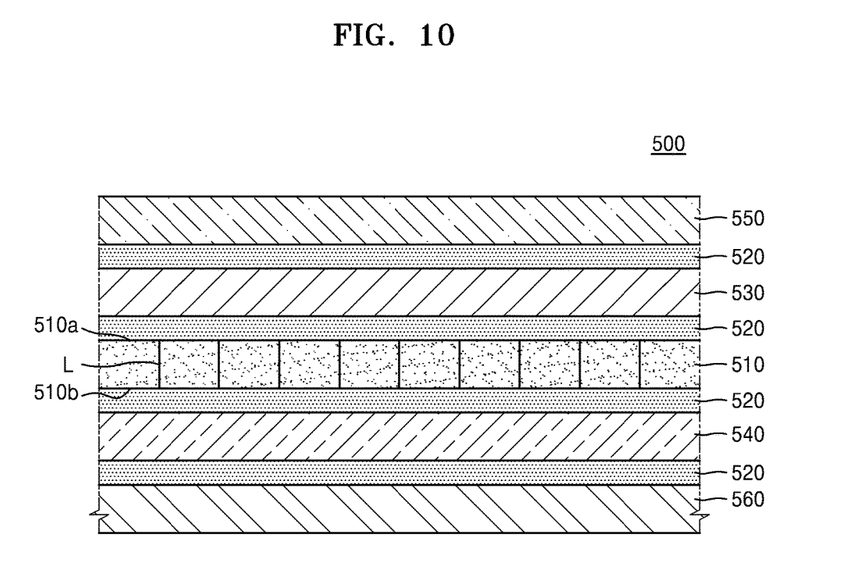
FIG. 10 is a schematic cross-sectional view of a cover according to another embodiment.

FIGS. 9A and 9B are schematic cross-sectional views of covers 500 according to another embodiment, and FIG. 10 is a schematic cross-sectional view of a cover 500 according to another embodiment. In FIGS. 9A, 9B, and 10, the same reference numerals as those used in FIGS. 3A to 3C refer to the same members, and redundant descriptions thereof will be omitted for conciseness.

As illustrated in FIGS. 9A and 9B, the cover 500 according to the embodiment may include a first film 510, a second film 530 over the first film 510, and a third film 540 under the first film 510. The second film 530 may be attached to a first surface 510a of the first film 510 by an adhesive layer 520, and the third film 540 may be attached to a second surface 510b of the first film 510 by an adhesive layer 520.

Alternatively, the first film 510, the second film 530, and the third film 540 may be respectively a buffer film, a light blocking film, and a heat dissipation film.

Alternatively, the first film 510, the second film 530, and the third film 540 may be respectively a buffer film, a light blocking film, and a shielding film.

Alternatively, the first film 510, the second film 530, and the third film 540 may be respectively a buffer film, a lower protective film, and a heat dissipation film.

As illustrated in FIG. 9A, when the first film 510 is a buffer film, the first film 510 includes a plurality of air pores. Thus, only the first film 510 having the highest probability of being torn in the bending process may include division lines L.

Alternatively, as illustrated in FIG. 9B, the second film 530 serving as the light blocking film or the lower protective film may include division lines L, and the third film 540 serving as the heat dissipation film or the shielding film may include division lines L.

Although FIG. 9B illustrates the cover 500 in which all the first to third films 510, 530, and 540 include the division lines L, embodiments of the present disclosure are not limited thereto. Any cover in which at least one of the first to third films 510, 530, and 540 includes the division lines L is applicable as embodiments of the present disclosure.

Alternatively, as illustrated in FIG. 10, the cover 500 may include a first film 510, a second film 530 and a fourth film 550 over the first film 510, and a third film 540 and a fifth film 560 under the first film 510.

The second film 530 may be attached to a first surface 510a of the first film 510 by an adhesive layer 520, and the third film 540 may be attached to a second surface 510b of the first film 510 by an adhesive layer 520. The fourth film 550 may be attached to the second film 530 by an adhesive layer 520, and the fifth film 560 may be attached to the fourth film 550 by an adhesive layer 520.

Alternatively, the first film 510, the second film 530, the third film 540, the fourth film 550, and the fifth film 560 may be respectively a buffer film, a light blocking film, a heat dissipation film, a lower protective film, and a shielding film.

In this case, since the first film 510 serving as the buffer film includes a plurality of air pores so as to absorb an external shock, the first film 510 has a low density and has the highest probability of being torn. Thus, the first film 510 may include the division lines L as illustrated in FIG. 10.

However, embodiments of the present disclosure are not limited thereto. Any cover in which at least one of the first to fifth films 510, 530, 540, 550, and 550 includes the division lines L is applicable as embodiments of the present disclosure.

According to one or more embodiments, the buffer film is not torn even in the bending portion.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A flexible display apparatus comprising:
   a substrate having a bending portion;
   a display over the substrate; and
   a cover over the substrate and covering the display,
   wherein the cover comprises:
   a first film having a first surface and a second surface opposite the first surface;
   a second film over the first film; and
   an adhesive layer between the first film and the second film and attaching the first film to the second film, and
   the first film comprises at least one division line in at least some regions thereof in a direction from the first surface toward the second surface, wherein a length of the at least one division line is less than a thickness of the first film.

2. The flexible display apparatus of claim 1, wherein the at least one division line is at a position corresponding to the bending portion.

3. The flexible display apparatus of claim 1, wherein the at least one division line comprises two or more division lines throughout the first film.

4. The flexible display apparatus of claim 1, wherein the length of the at least one division line is half the thickness of the first film.

5. The flexible display apparatus of claim 1, wherein the first film is a buffer film.

6. The flexible display apparatus of claim 5, wherein the first film comprises an elastomer-based material.

7. The flexible display apparatus of claim 6, wherein the first film comprises at least one selected from the group consisting of urethane, acrylate, and silicone.

8. The flexible display apparatus of claim 5, wherein the first film comprises a plurality of air pores and has a foam density of about 0.3 g/cm$^3$ to about 0.7 g/cm$^3$.

9. The flexible display apparatus of claim 5, wherein the first film has a thickness of about 50 μm to about 150 μm.

10. The flexible display apparatus of claim 1, wherein the at least one division line is formed from the first surface toward the second surface of the first film by a blanking process.

11. A flexible display apparatus comprising:
    a substrate having a bending portion;
    a display over the substrate; and
    a cover over the substrate and covering the display,
    wherein the cover comprises:
    a first film having a first surface and a second surface opposite the first surface;
    a second film over the first film; and
    an adhesive layer between the first film and the second film and attaching the first film to the second film, and
    the first film comprises at least one division line in at least some regions thereof in a direction from the first surface toward the second surface, each division line of the at least one division line being a cut in the first film that divides the first film into regions, wherein the at least one division line comprises two or more division lines, and
    an interval between the two or more division lines at a position corresponding to the bending portion is different from an interval between the two or more division lines at other positions.

12. The flexible display apparatus of claim 11, wherein the interval between the two or more division lines at the position corresponding to the bending portion is less than the interval between the two or more division lines at the other positions.

13. A flexible display apparatus comprising:
    a substrate having a bending portion;
    a display over the substrate; and
    a cover over the substrate and covering the display,
    wherein the cover comprises:
    a first film having a first surface and a second surface opposite the first surface;
    a second film over the first film; and
    an adhesive layer between the first film and the second film and attaching the first film to the second film, and
    the first film comprises at least one division line in at least some regions thereof in a direction from the first surface toward the second surface, each division line of the at least one division line being a cut in the first film that divides the first film into regions, wherein the first film further comprises a healing agent.

14. The flexible display apparatus of claim 13, wherein, when the first film is torn, a healing material discharged from the healing agent is cross-linked to a material constituting the first film.

15. A flexible display apparatus comprising:
    a substrate having a bending portion;
    a display over the substrate; and
    a cover over the substrate and covering the display,
    wherein the cover comprises:
    a first film having a first surface and a second surface opposite the first surface;
    a second film over the first film; and
    an adhesive layer between the first film and the second film and attaching the first film to the second film, and
    the first film comprises at least one division line in at least some regions thereof in a direction from the first surface toward the second surface, each division line of the at least one division line being a cut in the first film that divides the first film into regions, wherein the at least one division line comprises two or more division lines and an interval between the two or more division lines is in a range from about 10 μm to about 1 mm.

16. A flexible display apparatus comprising:
    a substrate having a bending portion;
    a display over the substrate; and
    a cover over the substrate and covering the display,
    wherein the cover comprises:
    a first film having a first surface and a second surface opposite the first surface;
    a second film over the first film; and
    an adhesive layer between the first film and the second film and attaching the first film to the second film,
    the first film comprises at least one division line in at least some regions thereof in a direction from the first surface toward the second surface, each division line of the at least one division line being a cut in the first film that divides the first film into regions; and a third film under the first film, wherein the second film is a light blocking film and the third film is a heat dissipation film.

* * * * *